(12) United States Patent
Fang et al.

(10) Patent No.: US 9,455,406 B1
(45) Date of Patent: Sep. 27, 2016

(54) METHOD OF FABRICATING ORGANIC LIGHT-EMITTING DIODE

(71) Applicant: Chien Hwa Coating Technology, Inc., Hsinchu (TW)

(72) Inventors: Hsiao-Ping Fang, Hsinchu (TW); Wei-Sheng Huang, Hsinchu (TW)

(73) Assignee: Chien Hwa Coating Technology, Inc., Hsinchu (TW)

( * ) Notice: Subject to any disclaimer, the term of this patent is extended or adjusted under 35 U.S.C. 154(b) by 0 days.

(21) Appl. No.: 14/995,204

(22) Filed: Jan. 14, 2016

(30) Foreign Application Priority Data

Oct. 27, 2015 (TW) .............................. 104135265 A (51) Int. Cl.
| | |
|---|---|
| *H01L 51/00* | (2006.01) |
| *H01L 51/56* | (2006.01) |
| *H01L 27/32* | (2006.01) |
| *H01L 51/50* | (2006.01) |

(52) U.S. Cl.
CPC ....... *H01L 51/0026* (2013.01); *H01L 27/3209* (2013.01); *H01L 51/0013* (2013.01); *H01L 51/0021* (2013.01); *H01L 51/56* (2013.01); *H01L 51/004* (2013.01); *H01L 51/0035* (2013.01); *H01L 51/5012* (2013.01); *H01L 51/5056* (2013.01); *H01L 51/5072* (2013.01)

(58) Field of Classification Search
None
See application file for complete search history.

(56) References Cited

U.S. PATENT DOCUMENTS

| | | | |
|---|---|---|---|
| 7,316,874 B2 | 1/2008 | Blanchet-Fincher | |
| 2006/0188697 A1* | 8/2006 | Lee | H01L 51/0013 428/156 |
| 2012/0098420 A1* | 4/2012 | Uchida | H01L 51/0013 313/504 |

FOREIGN PATENT DOCUMENTS

| | | |
|---|---|---|
| TW | 201308703 A | 2/2013 |
| TW | 201431694 A | 8/2014 |

* cited by examiner

*Primary Examiner* — Cheung Lee
(74) *Attorney, Agent, or Firm* — CKC & Partners Co., Ltd.

(57) ABSTRACT

A method of fabricating organic light-emitting diode is disclosed, and the method includes the following steps. A first organic material region and a second organic material region are formed on a film. The first organic region is heated by a heat source such that the heated first organic material region is laminated on a substrate to form a first organic material layer. The film is between the heat source and the first organic material region. The second organic region is heated by the heat source such that the heated second organic material region is laminated on the first organic material layer to form a second organic material layer. The film is between the heat source and the second organic material region.

10 Claims, 7 Drawing Sheets

METHOD OF FABRICATING ORGANIC LIGHT-EMITTING DIODE

RELATED APPLICATIONS

This application claims priority to Taiwan Application Serial Number 104135265, filed Oct. 27, 2015, which is herein incorporated by reference.

BACKGROUND

1. Field of Invention

The present invention relates to a method of fabricating an organic light-emitting diode. More particularly, the present invention relates to a method of fabricating an organic light-emitting diode by transferring an organic material region and a metallic material region on a film onto a substrate with a heat source.

2. Description of Related Art

An organic light-emitting diode (OLED) has a lot of advantages, including self-luminous, lightweight, thin characteristics and high sustainability, low driving voltage, wide viewing angle, high brightness, high luminance, high contrast ratio, fast response time, etc. As a result, it works without additional backlights and color filters, leading to a simple structure and lower cost. Therefore, it is a potential and applicable display technology.

A general structure of an OLED includes an anode, a cathode and organic material layers situated between the two electrodes. Traditionally, OLEDs can be fabricated by utilizing a vacuum thermal evaporation method, in which one organic material is first evaporated in a vacuum and deposited onto a substrate to form a single organic material layer, followed by deposition of other organic materials with the same process. Patterned OLEDs can further be achieved by utilizing masks. However, the traditional fabrication is complex, time-consuming and energy-consuming. Thermal evaporation apparatus utilized in the process is also more expensive. Besides, common fabrication methods such as spin coating and ink-jet printing still involve some essential problems. In the former, vaporized solvent utilized in forming one layer might dissolves organic materials in other layers. On the other hand, the thickness of layer is difficult to be controlled and easy to be inhomogeneous in the latter, leading to lower yields and efficiencies of OLEDs.

As a result, a new fabrication approach is still needed.

SUMMARY

In order to solve the above disadvantages of the prior arts, the instant invention provides a method of fabricating an organic light-emitting diode by transferring an organic material region and a metallic material region on a film onto a substrate with a heat source. The fabricating process of the method is quite simple and is capable of reducing process time. At the same time, the method has advantages such as low cost, low energy consumption, and low pollution. Moreover, the method can form a patterned organic light-emitting diode without mask.

One aspect of the instant disclosure is a method of fabricating organic light-emitting diode, and the method includes the following steps. A first organic material region and a second organic material region are formed on a film. The first organic region is heated by a heat source such that the heated first organic material region is laminated on a substrate to form a first organic material layer. The film is between the heat source and the first organic material region. The second organic region is heated by the heat source such that the heated second organic material region is laminated on the first organic material layer to form a second organic material layer. The film is between the heat source and the second organic material region.

In various embodiments of the instant disclosure, a material of the first organic material region and a material of the second organic material region are independently a hole injection material, a hole transport material, an light-emitting material, an electron transport material, or an electron injection material.

In various embodiments of the instant disclosure, the method further includes the following steps. A metallic material region is formed on the film. The metallic material region is heated by the heat source such that the heated metallic material region is laminated on the second organic material layer.

In various embodiments of the instant disclosure, the method further includes the following steps. A metallic material region is formed on the film. The metallic material region is heated by the heat source such that the heated metallic material region is laminated on the substrate.

In various embodiments of the instant disclosure, the film includes a first film and a second film, the first organic material region is on the first film, and the second organic material region is on the second film.

In various embodiments of the instant disclosure, the method further includes a pressure source. The heated first organic material region is laminated on the substrate by both the heat source and the pressure source and the heated second organic material region is laminated on the first organic material layer by both the heat source and the pressure source.

In various embodiments of the instant disclosure, the step of forming the first organic material region and the second organic material region on the film is performed by spin coating, slot die coating, ink-jet printing, gravure printing, screen printing, chemical vapor deposition, physical vapor deposition, sputtering, or spray coating.

In various embodiments of the instant disclosure, a material of the film includes polyethylene terephthalate, polyimide, polyamide-imide, polyester, or polypropylene.

In various embodiments of the instant disclosure, the heat source includes a plurality of subregions, and a portion of the plurality of subregions provides heating temperature.

In various embodiments of the instant disclosure, the heat source provides different heating temperature at different times.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

The following embodiments are disclosed with accompanying diagrams for detailed description. For illustration clarity, many details of practice are explained in the following descriptions. However, it should be understood that these details of practice do not intend to limit the present invention. That is, these details of practice are not necessary in parts of embodiments of the present invention. Furthermore, for simplifying the drawings, some of the conventional structures and elements are shown with schematic illustrations.

As used herein, the singular forms "a," "an" and "the" include plural referents unless the context clearly dictates otherwise. Therefore, reference to, for example, a layer includes aspects having two or more such layers, unless the context clearly indicates otherwise. Reference throughout the specification to "one embodiment" means that a particular feature, structure, implementation, or characteristic described in connection with the embodiments is included in at least one embodiment of the present disclosure. Thus, uses of the phrases "in one embodiment" in various places throughout the specification are not necessarily all referring to the same embodiment. Furthermore, the particular features, structures, implementation, or characteristics may be combined in any suitable manner in one or more embodiments.

As used herein, the terms "comprising," "including," "having," "containing," "involving," and the like are to be understood to be open-ended, i.e., to mean including but not limited to.

Furthermore, relative terms, such as "lower" or "bottom" and "upper" or "top", may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper", depending of the particular orientation of the figure.

The instant invention provides a method of fabricating an organic light-emitting diode. An organic material region or a metallic material region is formed on a film. Next, the organic material region or the metallic material region is heat by a heat source such that the heated organic material region or the heated metallic material region is laminated on a substrate or an organic material layer to form an organic light-emitting diode. Moreover, because the heat source includes a plurality of subregions which are capable of adjusting heating temperature, a patterned organic light-emitting diode can be formed.

Figure 1A:
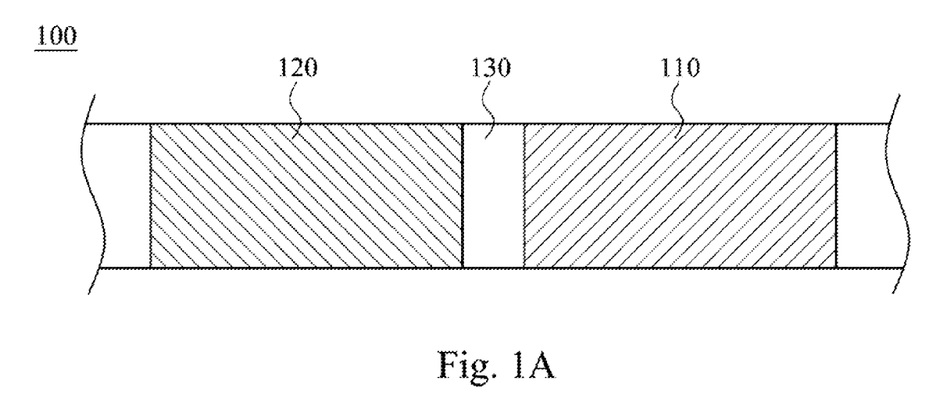
FIG. 1A shows an organic material ribbon, in accordance with various embodiments of instant disclosure.
Figure 1B:
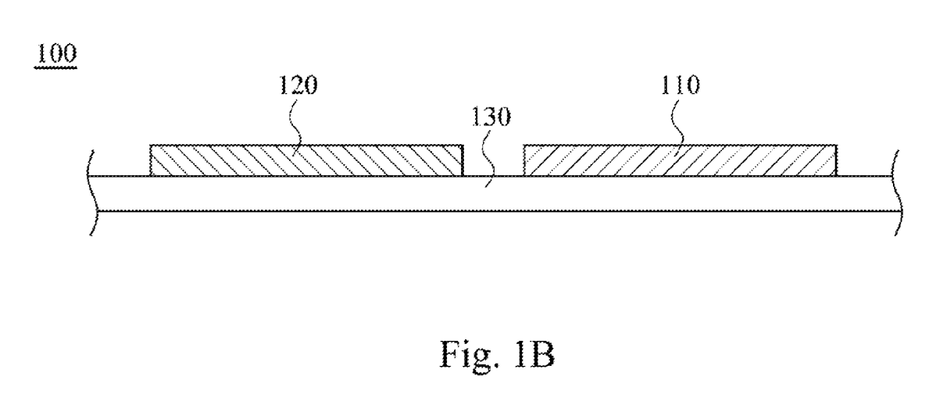
FIG. 1B is a cross-sectional view of the organic material ribbon shown in FIG. 1A.

Please refer to FIGS. 1A and 1B. FIG. 1A shows an organic material ribbon, in accordance with various embodiments of instant disclosure. FIG. 1B is a cross-sectional view of the organic material ribbon shown in FIG. 1A. A first organic material and a second organic material region 120 are formed on a film 130 to form an organic material ribbon 100. In one embodiment, the first organic material region 110 and the second organic material region 120 are formed on a film 130 by spin coating, slot die coating, ink-jet printing, gravure printing, screen printing, chemical vapor deposition (CVD), physical vapor deposition (PVD), sputtering, or spray coating.

In one embodiment, a material of the film 130 includes polyethylene terephthalate, polyimide, polyamide-imide, polyester, or polypropylene. In one embodiment, a material of the first organic material region 110 and a material of the first organic material region 120 are independently a hole injection material, a hole transport material, a light-emitting material, an electron transport material, or an electron injection material.

More specifically, the hole injection material includes molybdenum trioxide ($MoO_3$), vanadium (V) oxide ($V_2O_5$), tungsten trioxide ($WO_3$) or poly(3,4-ethylenedioxythiophene) polystyrene sulfonate (PEDOT:PSS).

More specifically, the hole transport material includes copper(II) phthalocyanine (CuPC), 2,3,6,7,10,11-hexacyano-1,4,5,8,9,12-hexaazatriphenylene (HAT-CN), 4,4',4''-tris(carbazol-9-yl)triphenylamine (TCTA), or N,N'-bis(naphthalen-1-yl)-N,N'-bis(phenyl)-benzidine (NPB).

More specifically, the light-emitting material includes phosphorescent material, fluorescent material, or a combination thereof. The phosphorescent material and fluorescent material may emit red light, blue light, green light, or mixed light generated by the above light. For, example, the light-emitting material includes poly[2-methoxy-5-(2'-ethylhexyloxy)-1,4-phenylene vinylene] (MEH-PPV), poly(3-hexylthiophene) (P3HT), polyfluorene (PF), tris(8-hydroxy quinoline) aluminum (III) ($Alq_3$), or platinum-octaethyl-porphyrin (PtOEP).

More specifically, the electron transport material includes 4,7-diphenyl-1,10-phenanthroline (BPhen), 1,3,5-tri(m-pyridin-3-ylphenyl)benzene (TmPyPhB), 2-methyl-9,10-di[2-naphthyl]anthracene (MADN), bathocuproine (BCP), or 1,3,5-tris(1-phenyl-1H-benzimidazol-2-yl)benzene (TPBI).

Figure 2A:
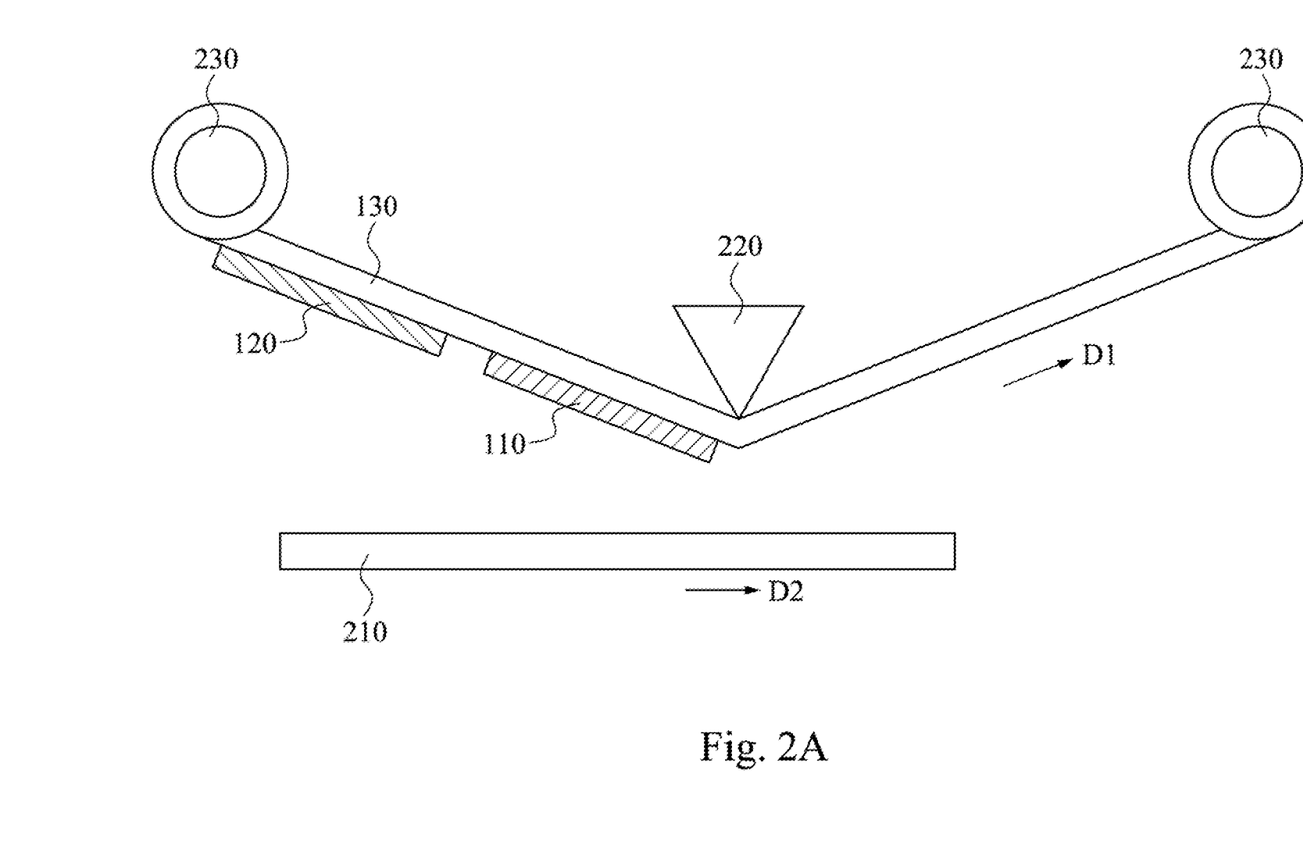
FIGS. 2A-2D show cross-sectional views of an organic material stack at various stages of fabrication, in accordance with various embodiments of instant disclosure.

Please refer to FIGS. 2A-2D. FIGS. 2A-2D show cross-sectional views of an organic material stack at various stages of fabrication, in accordance with various embodiments of instant disclosure. As shown in FIG. 2A, the two terminals of organic material ribbon 100 in FIG. 1B are rounded respectively along a rolling device 230, which could roll the organic material ribbon 100 along the direction D1. On the other hand, the organic material ribbon 100 is situated between a heat source 220 and a substrate 210. While the first organic material region 110 is rolled into the region between the heat source 220 and the substrate 210, thermal energy from the heat source 220 could penetrate the film 130 and thus heat the first organic material region 110. During the process of rolling and heating the first organic material region 110, the substrate 210 is moved along the direction D2 and employed to accept the heated first organic material region 110, and the heated first organic material region 110 is thus laminated on the substrate 210 to form the first organic material layer 112 shown in FIG. 2B. Specifically, this laminating process requires a contact between the first organic material region 110 and the substrate 210 to transfer the former onto the latter.

Figure 2B:
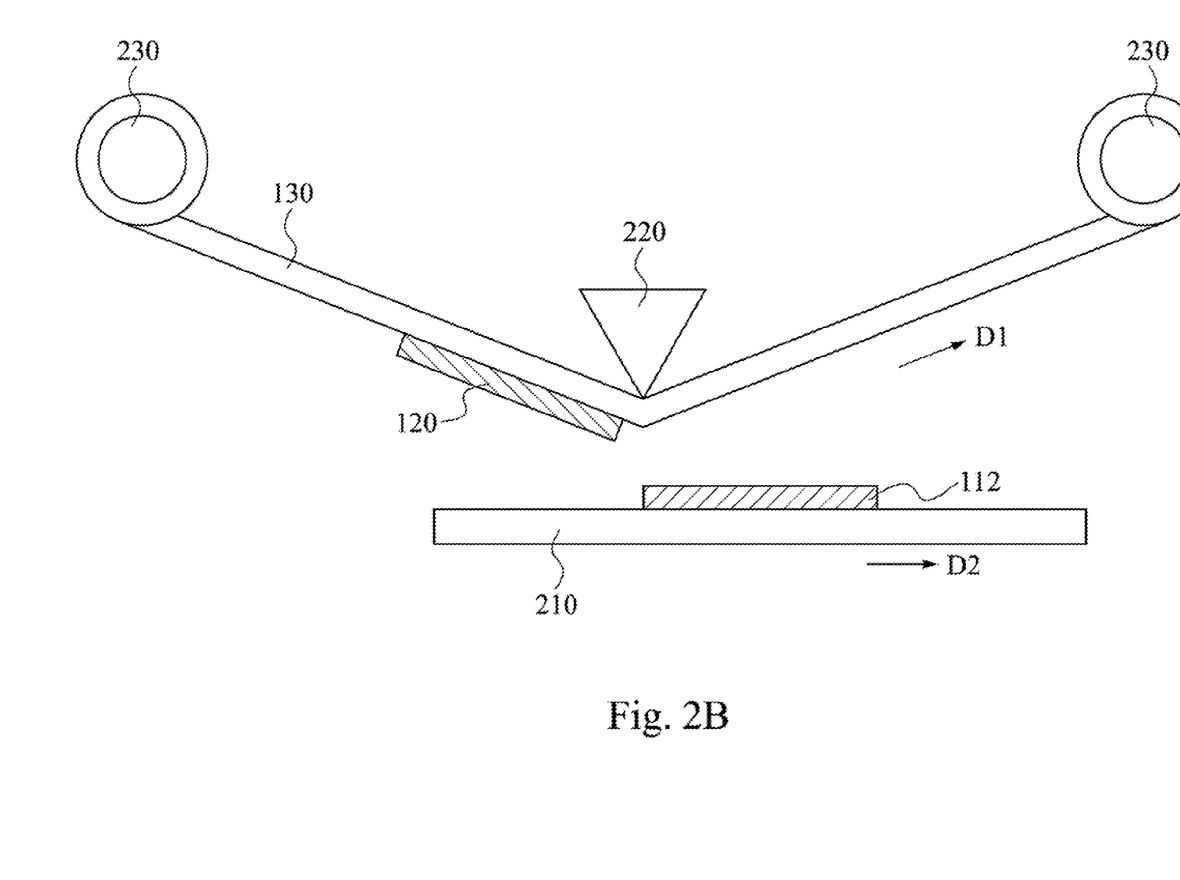

In one embodiment, the laminating process further includes a pressure source. The heat source 220 and the pressure source concurrently make the first organic material region 110 laminate onto the substrate 210. For instance, in the heating process, the heat source 220 is pressed downward, making the first organic material region 110 contact with the substrate 210. In this case, the heat source 220 is also the pressure source. By employing a larger adhesive force between the heated first organic material region 110 and the substrate 210 than between the heated first organic material region 110 and the film 130, the first organic material region 110 can be detached from the film 130 and transferred onto the substrate 210, forming the first organic material layer 112.

Figure 2C:
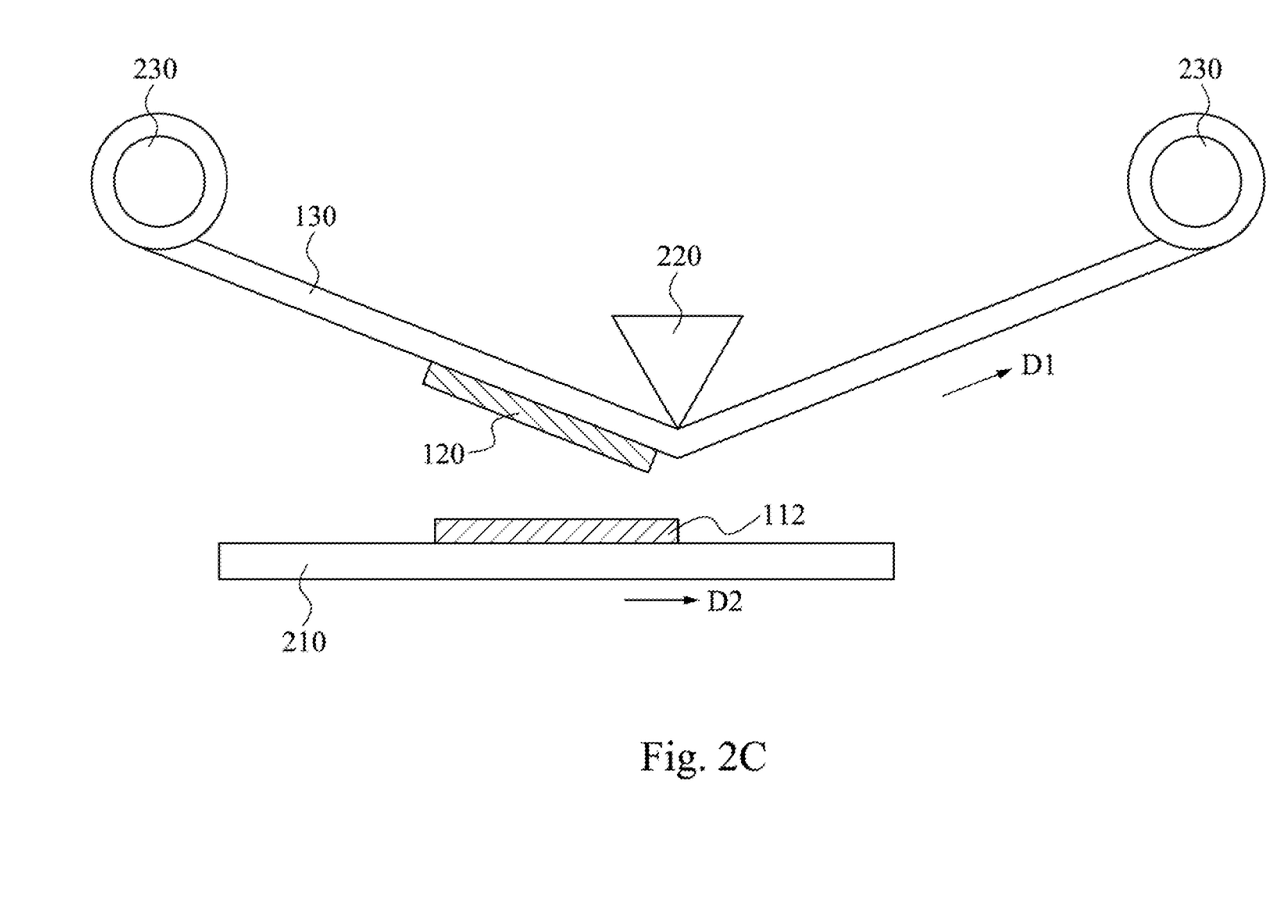

Please refer to FIG. 2C. In FIG. 2C, the substrate 210 is moved back to its original position as shown in FIG. 2A. That is, the front end of the organic material layer 112 is situated below the heat source 220. The organic material ribbon 100 is rolled along the direction D1, making the second organic material region 120 move into the region between the heat source 220 and the first organic material layer 112. In the meanwhile, thermal energy can penetrate the film 130 and thus heat the second organic material region 120. During the process of rolling and heating the second organic material region 120, the substrate 210 would be moved along the direction D2 simultaneously, leading to the lamination of the heated second organic material region 120 onto the first organic material layer 112 and formation of the second organic material layer 122 shown in the FIG. 2D. Specifically, this laminating process requires a contact between the second organic material region 120 and the first organic material layer 112 to transfer the former onto the latter. According to the processes depicted in FIGS. 2A-2C, the first organic material layer 112 and the second organic material layer 122 can be deposited onto the substrate 210 to form a stack.

Figure 2D:
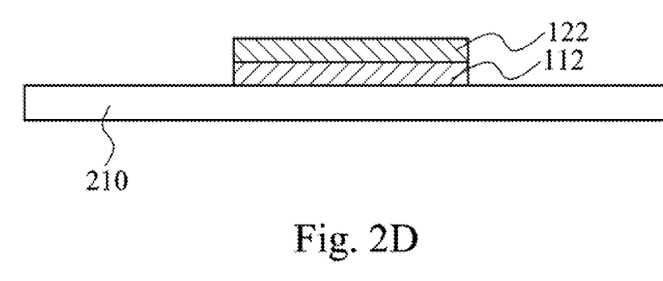

In one embodiment, the laminating process includes a pressure source. The heat source 220 and the pressure source concurrently make the second organic material region 120 laminate onto the first organic material layer 112. For instance, in the heating process, the heat source 220 is pressed downward, making the second organic material region 120 contact with the first organic material layer 112. In this case, the heat source 220 is also the pressure source. By employing a larger adhesive force between the heated second organic material region 120 and the first organic material layer 112 than between the heated second organic material region 120 and the film 130, the heated second organic material region 120 can be detached from the film 130 and transferred onto the first organic material layer 112, forming the second organic material layer 122.

In one embodiment, the first organic material region 110 and the second organic material region 120 can be formed on different films respectively. For example, the first organic material region 110 is formed on a first film, while the second organic material region 120 is formed on a second film. The fabrication process of a stack of the first organic material layer 112 and the second organic material layer 122 shown in FIG. 2D can be achieved within the concept of the embodiment depicted in FIGS. 2A-2C.

In one embodiment, the laminating process further includes a formation of a metallic material region on films (not shown). Moreover, according to the embodiment involving laminating the first organic material region 110 onto the substrate 210 which are depicted in FIGS. 2A-2B, the metallic material region can be similarly heated by a heat resource, and then laminated onto the substrate.

In one embodiment, the laminating process further includes a formation of a metallic material region on films (not shown). Moreover, according to the embodiment involving laminating the second organic material region 120 onto the first organic material layer 112. The metallic material region can be similarly heated by a heat resource, and then laminated onto the second organic material layer.

In one embodiment, a material of the metallic material region includes indium zinc oxide (IZO), indium tin oxide (ITO), magnesium-silver alloy (Mg:Ag), aluminium, silver, gold, calcium, nickel, platinum, lithium, zinc oxide or aluminium-doped zinc oxide (AZO, Al:ZnO).

Figure 3A:
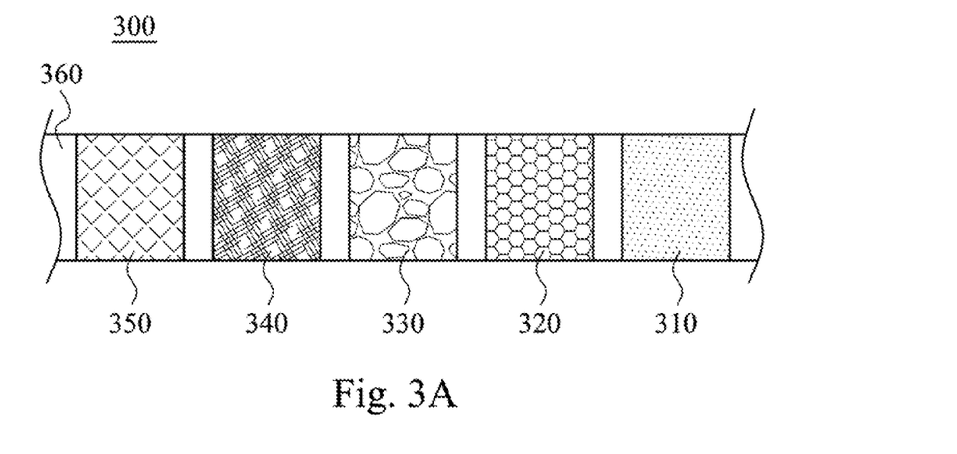
FIG. 3A shows an organic-inorganic material ribbon, in accordance with various embodiments of instant disclosure.

Please refer to FIG. 3A. FIG. 3A shows an organic-inorganic material ribbon, in accordance with various embodiments of instant disclosure. The organic-inorganic material ribbon 300 includes a film 360, on which a first metallic material region 310, a first carrier transport material region 320, a light-emitting material region 330, a second carrier transport material region 340 and a second metallic material region 350 are coated.

Figure 3B:
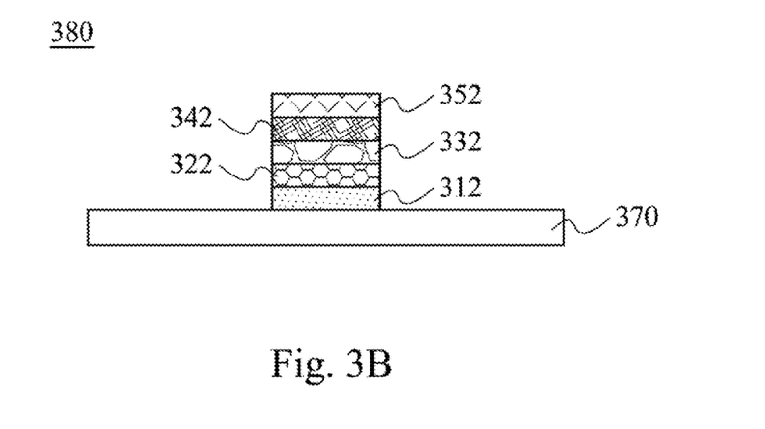
FIG. 3B shows an organic light-emitting diode component, in accordance with various embodiments of instant disclosure.

As shown in FIG. 3B, following the embodiment illustrated in FIGS. 2A-2D, the first metallic material region 310 is laminated onto a substrate 370, forming a first metal layer 312. Then the first carrier transport material region 320 is laminated onto the first metal layer 312, forming a first carrier transport layer 322. Following the same procedure, the light-emitting layer 332, the second carrier transport layer 342 and the second metal layer 352 are fabricated onto the first carrier transport layer 322 in order, forming an OLED component 380 as shown in FIG. 3B. In one embodiment, the substrate 370 is glass substrate or PET substrate. In another embodiment, the substrate 370 includes at least a thin-film transistor (TFT), providing driven current to the OLED component 380.

In one embodiment, the first metal layer 312 is an anode, the first carrier transport layer 322 is a hole transport layer, the second carrier transport layer 342 is an electron transport layer and the second metal layer 352 is a cathode. Therefore, the OLED component 380 in this case is forward-stacked.

In one embodiment, the first metal layer 312 is a cathode, the first carrier transport layer 322 is an electron transport layer, the second carrier transport layer 342 is a hole transport layer and the second metal layer 352 is an anode. Therefore, the OLED component 380 in this case is inverted-stacked.

In one embodiment, an anode can be formed onto the substrate 370 in advance. For example, a material of the anode is ITO. Then following the embodiment illustrated in FIGS. 2A-2D, a hole transport layer, a light-emitting layer, an electron transport layer and an cathode are formed onto the anode in order.

In one embodiment, a hole injection material region, a electron injection material region or a combination thereof is further fabricated on the organic-inorganic material ribbon 300, forming an OLED containing the hole injection layer, the electron injection layer or a combination thereof.

Figure 4:
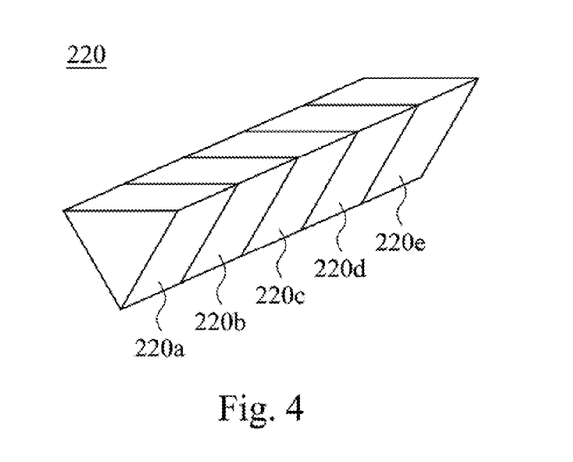
FIG. 4 shows a schematic perspective view of a heat source, in accordance with various embodiments of instant disclosure.

Please refer to FIG. 4. FIG. 4 shows a schematic perspective view of a heat source, in accordance with various embodiments of instant disclosure. The heat source 220 contains a plurality of subregions 220a, 220b, 220c, 220d and 220e, each of which can provide different heating temperature and provide different heating temperature at different times. In other words, each of subregions provides the time-dependent heating temperature. The heating temperature is high enough to make the organic material region or metallic material region on the film laminate onto the organic material layer or the substrate.

Figure 5A:
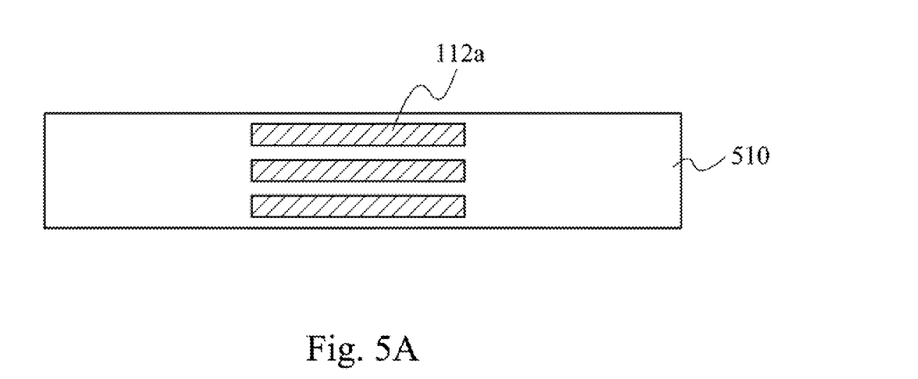
FIG. 5A shows a top view of a structure of organic light-emitting diode, in accordance with various embodiments of instant disclosure.
Figure 5B:
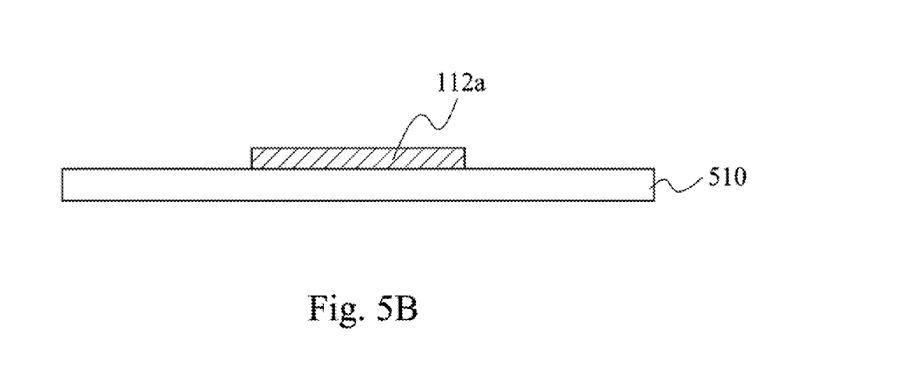
FIG. 5B shows a cross-sectional view of the structure of organic light-emitting diode shown in FIG. 5A.

In one embodiment, only some of the subregions provide heating temperature. For example, the subregions 220a, 220c and 220e provide constant heating temperatures; however, the subregions 220b and 220e do not. Please refer to FIGS. 5A and 5B. FIG. 5A shows a top view of a structure of organic light-emitting diode, in accordance with various embodiments of instant disclosure. On the other hand, FIG. 5B shows a cross-sectional view of the structure of organic light-emitting diode shown in FIG. 5A. As the organic material ribbon 100 shown in FIG. 100 is heated by the heat source 220, only those heated portions of the first organic material region 110 would laminate onto the substrate 510, forming a patterned organic material layer 112a with stripe pattern as shown in FIG. 5A. Notice that the longitudinal directions of the stripe pattern and the substrate 510 are parallel. Following a similar procedure as shown in FIG. 5A, patterned organic material layers (not shown) and a patterned metal layer (not shown) can be fabricated onto the first organic material layer 112a, forming a patterned OLED with stripe pattern.

Figure 6A:
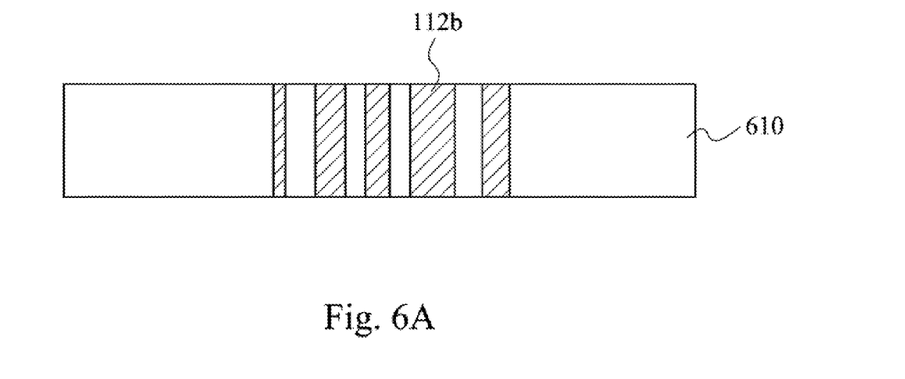
FIG. 6A shows a top view of a structure of organic light-emitting diode, in accordance with various embodiments of instant disclosure.
Figure 6B:
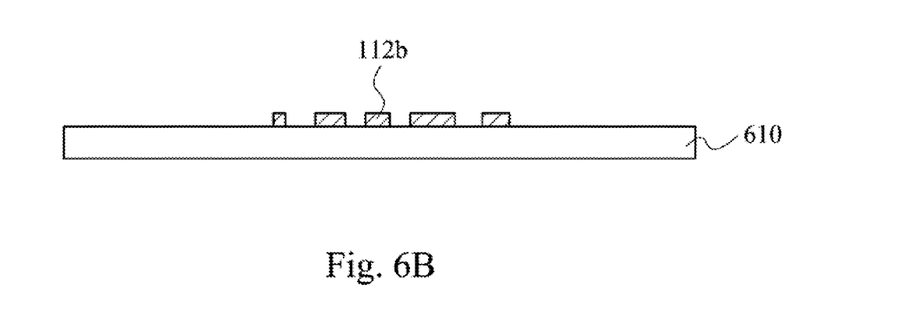
FIG. 6B shows a cross-sectional view of the structure of organic light-emitting diode shown in FIG. 6A.

In one embodiment, these provide different heating temperature at different times. In other words, heating temperatures provided in the subregions are time-dependent. For instance, the whole heat source 220 (including 220a, 220b, 220c, 220d and 220e) furnishes high enough temperature which makes the organic material region or metallic material region laminate onto the organic material layer or substrate at some period, accompanied with another period without providing heating temperature. By repeating these two processes, a patterned organic material layer as shown in FIG. 6A and FIG. 6B can be achieved. FIG. 6A shows a top view of a structure of organic light-emitting diode, in accordance with various embodiments of instant disclosure. FIG. 6B shows a cross-sectional view of the structure of organic light-emitting diode shown in FIG. 6A. As the organic material ribbon 100 shown in FIG. 1B is heated by the heat source 220, only those heated portions of the first organic material region 110 would laminated onto the substrate 610, forming another type of patterned organic material layer 112b with stripe pattern as shown in FIG. 6A. Notice that the longitudinal directions of the stripe pattern and the substrate 610 are perpendicular. Following a similar procedure as shown in FIG. 6A, patterned organic material layers (not shown) and a patterned metal layer (not shown) can be fabricated onto the first organic material layer 112b, forming a patterned OLED with stripe pattern.

In one embodiment, combining the embodiments illustrated in FIGS. 5A-SB and FIGS. 6A-6B, various patterned OLEDs can be generated on a substrate.

In conclusion, the instant disclosure provides a novel fabrication approach of OLEDs. The OLEDs is fabricated by transferring the organic material region and metallic material region on the film onto the substrate by utilizing the heat source. In the procedure, the heat source can heat the organic material region and metallic material region concentratedly and steadily. Besides, the heat transfer would not influence previous fabrications of organic material layers and metallic material layers. Furthermore, the procedure is not only simple but also reduces process time and the patterned OLEDs can be achieved without utilizing the masks.

Although the present invention has been described in considerable detail with reference to certain embodiments thereof, other embodiments are possible. It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A method of fabricating an organic light-emitting diode, comprising:
    forming a first organic material region and a second organic material region on a film to form a material ribbon;
    rounding a portion of the material ribbon on a rolling device;
    heating the first organic material region by a heat source such that the heated first organic material region is laminated on a substrate to form a first organic material layer, wherein the film is between the heat source and the first organic material region;
    rolling the material ribbon by the rolling device to shift the second organic material region over the first organic material layer; and
    heating the second organic material region by the heat source such that the heated second organic material region is laminated on the first organic material layer to form a second organic material layer, wherein the film is between the heat source and the second organic material region.

2. The method of claim 1, wherein a material of the first organic material region and a material of the second organic material region are independently a hole injection material, a hole transport material, an light-emitting material, an electron transport material, or an electron injection material.

3. The method of claim 1, further comprising:
    forming a metallic material region on the film; and
    heating the metallic material region by the heat source such that the heated metallic material region is laminated on the second organic material layer.

4. The method of claim 1, further comprising:
    forming a metallic material region on the film; and
    heating the metallic material region by the heat source such that the heated metallic material region is laminated on the substrate.

5. The method of claim 1, wherein the film comprises a first film and a second film, the first organic material region is on the first film, and the second organic material region is on the second film.

6. The method of claim 1, further comprising a pressure source, the heated first organic material region laminated on the substrate by both the heat source and the pressure source, and the heated second organic material region laminated on the first organic material layer by both the heat source and the pressure source.

7. The method of claim 1, wherein the step of forming the first organic material region and the second organic material region on the film is performed by spin coating, slot die coating, ink-jet printing, gravure printing, screen printing, chemical vapor deposition, physical vapor deposition, sputtering, or spray coating.

8. The method of claim 1, wherein a material of the film comprises polyethylene terephthalate, polyimide, polyamide-imide, polyester, or polypropylene.

9. The method of claim 1, wherein the heat source comprises a plurality of subregions, and a portion of the plurality of subregions provides heating temperature.

10. The method of claim 1, wherein the heat source provides different heating temperature at different times.

\* \* \* \* \*